United States Patent
Komori et al.

[11] Patent Number: 5,948,514
[45] Date of Patent: Sep. 7, 1999

[54] PHOTOCURABLE THERMOSETTTING RESIN COMPOSITION DEVELOPABLE WITH AQUEOUS ALKALI SOLUTION

[75] Inventors: Shigeru Komori, Konosu; Kazuo Suda, Ome; Masao Arima; Miyako Juni, both of Sakado, all of Japan

[73] Assignee: Taiyo Ink Manufacturing Co., Ltd., Japan

[21] Appl. No.: 08/658,446

[22] Filed: Jun. 5, 1996

[30] Foreign Application Priority Data

Jun. 6, 1995 [JP] Japan .................................... 7-164697
Apr. 30, 1996 [JP] Japan .................................... 8-130617

[51] Int. Cl.$^6$ .......................... C08G 59/14; C08G 59/17; C09D 163/02
[52] U.S. Cl. .................. 428/209; 430/280.1; 430/286.1; 430/287.1; 522/37; 522/40; 522/42; 522/43; 522/44; 522/45; 522/46; 522/53; 522/63; 522/64; 522/79; 522/80; 522/100; 522/103
[58] Field of Search ..................... 522/100, 101, 522/103, 37, 40, 42, 43, 44, 45, 46, 53, 63, 64, 79, 80; 430/280.1, 286.1, 287.1; 428/209

[56] References Cited

U.S. PATENT DOCUMENTS

| | | | |
|---|---|---|---|
| 4,789,620 | 12/1988 | Sasaki et al. | 522/101 |
| 4,970,135 | 11/1990 | Kushi et al. | 522/100 |
| 5,304,628 | 4/1994 | Kinoshita et al. | 522/100 |
| 5,319,060 | 6/1994 | Nishikawa et al. | 528/89 |
| 5,538,821 | 7/1996 | Kakinuma et al. | 522/100 |

FOREIGN PATENT DOCUMENTS

| | | |
|---|---|---|
| 0 632078 A1 | 1/1995 | European Pat. Off. |
| 0646845 A1 | 4/1995 | European Pat. Off. |
| 2-173749 | 7/1990 | Japan . |
| 2-173750 | 7/1990 | Japan . |
| 2-173751 | 7/1990 | Japan . |
| 2-269166 | 11/1990 | Japan . |
| 6-41485 | 2/1994 | Japan . |
| 06332169 | 12/1994 | Japan . |
| 119810 | 7/1970 | United Kingdom . |
| 1497651 | 1/1978 | United Kingdom . |
| 2175908 | 12/1986 | United Kingdom . |

*Primary Examiner*—Susan W. Berman
*Attorney, Agent, or Firm*—Rader, Fishman & Grauer; Ronald P. Kananen

[57] ABSTRACT

A photocurable and thermosetting resin composition developable with an aqueous alkali solution is disclosed. The composition comprises in combination: (A) a photosensitive prepolymer soluble in a dilute aqueous alkali solution obtained by esterifying an epoxy resin represented by the following general formula (1) with (meth)acrylic acid and further adding an acid anhydride thereto until an acid value reaches a level in the range of 60 to 120 mg KOH/g, (B) a diglycidyl ether type epoxy compound containing two epoxy groups in the molecular unit thereof, (C) a photopolymerization initiator, and (D) a diluent at such ratios of combination that said epoxy compound (B) accounts for a proportion in the range of 5 to 120 parts by weight and said photopolymerization initiator (C) for a proportion in the range of 0.1 to 30 parts by weight, based on 100 parts by weight of said photosensitive prepolymer (A):

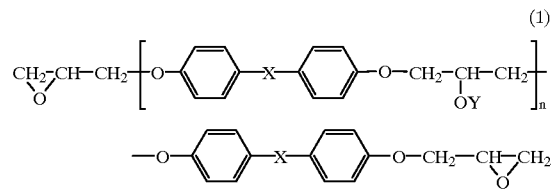

wherein X represents $CH_2$, $C(CH_3)_2$, or $SO_2$, n is an average value in the range of 1 to 12, and Y represents a hydrogen atom or a glycidyl group, providing that Y is a glycidyl group where n is 1 and at least one of the plurality of Y's is a glycidyl group where n is 2 or more.

18 Claims, No Drawings

PHOTOCURABLE THERMOSETTTING RESIN COMPOSITION DEVELOPABLE WITH AQUEOUS ALKALI SOLUTION

BACKGROUND OF THE INVENTION

1. Field of the Invention

This invention relates to a photocurable and thermosetting resin composition developable with an aqueous alkali solution which is useful as a resist ink for use in the manufacture of a printed circuit board, and more particularly as a photographically developable ink capable of forming an image through exposure to an active energy ray and subsequent development with an aqueous alkali solution and giving rise to a cured film exhibiting flexibility and resistance to the heat of soldering and which is particularly useful as a solder resist ink to be applied to a flexible printed circuit board.

2. Description of the Prior Art

To protect a wiring (circuit) pattern formed on a substrate as by the screen printing technique against the action of an external environment or to preclude accidental adhesion of solder to the areas abhorring solder in the soldering process which is carried out in mounting electronic parts on the surface of a printed circuit board, the practice of depositing on the printed circuit board a protective layer called a cover coat or solder mask is prevalent.

The solder resist inks which have heretofore found utility in the field of applications mentioned above are mainly based on polyfunctional epoxy resin-containing compositions. The cured films which are produced with these solder resist inks indeed exhibit satisfactory resistance to heat but suffer from deficiency in flexibility. These solder resist inks, therefore, have had their utility limited to rigid boards which are not demanded to exhibit the flexibility (folding property) that is proper for a cured film. Thus, they do not find easy acceptance for use in flexible printed circuit boards (FPC) which have been finding growing use in recent years.

In the light of the true state of affairs mentioned above, numerous species of resist inks whose cured films possess flexibility have been proposed. Published Japanese Patent Application, KOKAI (Early Publication) No. (hereinafter referred to briefly as "JP-A-") 2-269,166, for example, proposes a thermosetting solder resist ink which comprises polyparabanic acid, epoxy resin, and a polar solvent and JP-A-6-41,485 proposes a thermally drying solder resist ink which has polyparabanic acid and phenoxy resin as essential components thereof. Since these solder resists are intended to form a resist pattern by means of screen printing, however, they are at a disadvantage in producing such phenomena as exudation from paper or inferior transfer to a surface during the course of printing, limiting the allowable width of lines of a screen, and incurring difficulty in allowing formation of an image so fine as to conform to the latest level of densification of circuits.

In more recent years, therefore, solder resist inks of the photographic developing type have been proposed as by, for example, JP-A-2-173,749, JP-A-2-173,750, and JP-A-2-173,751. They are, however, incapable of providing fully ample flexibility of cured film aimed at.

SUMMARY OF THE INVENTION

It is, therefore, an object of the present invention to provide a photocurable and thermosetting resin composition developable with an aqueous alkali solution which permits a fine image appropriate for the high densification of printed circuits prevalent today to be formed through exposure to an active energy ray and subsequent development with an aqueous alkali solution and allows a cured film rich in flexibility to be obtained through thermal setting at the post curing step and enables formation of a film excelling in resistance to the heat of soldering, resistance to the deterioration by heat, resistance to the action of electroless gold plating, resistance to acids, and water resistance.

To accomplish the object mentioned above, the present invention provides a photocurable and thermosetting resin composition developable with an aqueous alkali solution, which comprises in combination (A) a photosensitive prepolymer soluble in a dilute aqueous alkali solution obtained by esterifying an epoxy resin represented by the following general formula (1) with (meth)acrylic acid thereby effecting acrylic modification thereof and further adding an acid anhydride thereto until an acid value reaches a level in the range of 60 to 120 mg KOH/g, (B) a diglycidyl ether type epoxy compound containing two epoxy groups in the molecular unit thereof, (C) a photopolymerization initiator, and (D) a diluent at such ratios of combination that the epoxy compound (B) accounts for a proportion in the range of 5 to 120 parts by weight and the photopolymerization initiator (C) for a proportion in the range of 0.1 to 30 parts by weight, based on 100 parts by weight of the photosensitive prepolymer (A).

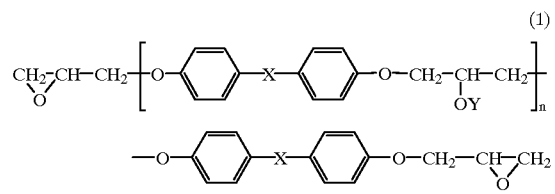

wherein X represents $CH_2$, $C(CH_3)_2$, or $SO_2$, n is an average value of 1 to 12, and Y represents a hydrogen atom or a glycidyl group, providing that Y is a glycidyl group where n is 1 and at least one of the plurality of Y's is a glycidyl group where n is 2 or more.

DETAILED DESCRIPTION OF THE INVENTION

The present inventors, after pursuing a diligent study with the object of solving the problems mentioned above, have found that this object is accomplished by a composition which has as essential components thereof a photosensitive prepolymer soluble in a dilute aqueous alkali solution obtained by esterifying an epoxy resin possessing a bisphenol type backbone structure with (meth)acrylic acid thereby effecting acrylic modification thereof and further adding an acid anhydride thereto and a diglycidyl ether type epoxy compound containing two epoxy groups in the molecular unit thereof. This knowledge has led to perfection of the present invention.

When a solder resist is vested with ample flexibility and consequently softened, it suffers degradation of such properties as resistance to the heat of soldering which the solder resist is inherently demanded to possess. Conversely, when a solder resist is obtained in the form of a cured film tough and rich in rigidity and is consequently vested with ample resistance to the heat of soldering, it is deprived with flexibility.

The photosensitive resins which are used in a solder resist ink composition developable with an aqueous alkali solution, for example, are generally represented by the resin that is obtained by esterifying a cresol novolak type epoxy resin or a phenol novolak type epoxy resin with (meth) acrylic acid so as to effect acrylic modification thereof and further adding an acid anhydride thereto. Since the photosensitive resin thus manufactured has an aromatic residue of high rigidity in a large proportion, it acts advantageously to improve such properties as the resistance to heat. Since it exhibits unduly high rigidity, however, it acts negatively concerning the flexibility of the cured film. This remark holds good for the epoxy resin which is used as a thermally curing component.

In contrast thereto, the photocurable and thermosetting resin composition of the present invention succeeds in simultaneously satisfying such contradictory requirements as mentioned above by using (A) a photosensitive prepolymer soluble in a dilute aqueous alkali solution obtained by esterifying an epoxy resin represented by the aforementioned general formula (1) with (meth)acrylic acid thereby effecting acrylic modification thereof and further adding an acid anhydride thereto until an acid value reaches a level in the range of 60 to 120 mg KOH/g in combination with (B) a bifunctional diglycidyl ether type epoxy compound containing two epoxy groups in the molecular unit thereof.

It is inferred that the use of the straight-chain epoxy resins containing numerous ether bonds as the backbone resin of a photosensitive prepolymer prior to incorporating therein a carboxyl group through the acrylic modification and the subsequent addition of an acid anhydride and also as an epoxy compound, a thermosetting component, contributes to the repression of the proportion of the aromatic residue of high rigidity to a relatively low level and the manifestation of the flexibility of the cured film and, at the same time, that the fair ease of rotation of the molecular chain part between the two ether bonds contributes to the manifestation of the flexibility. It is further inferred that the increase in the molecular weight between the points of cross-linkage in the cured photosensitive prepolymer (namely the elongation of the chain between the points of cross-linkage) also contributes to the exaltation of the flexibility of the cured film.

Now, the actions of the components mentioned above will be described more specifically below. If a monofunctional epoxy compound containing one epoxy group in the molecular unit is used as the epoxy compound (B) to be contained as a thermosetting component in the composition, the growth in density of the cross-linkage or the increase in the molecular weight owing to the curing reaction during the course of post curing will not be duly large and the produced cured film will fail to acquire thoroughly satisfactory properties. Conversely, if a trifunctional or higher epoxy compound is used, the density of cross-linkage will be unduly heightened by the post curing and the cured film will be tough and yet so rigid as to cause a reduction in flexibility. It is, therefore, preferable to use an epoxy compound formed mainly of a bifunctional epoxy resin having a relatively large initial molecular weight (a rather larger epoxy equivalent weight) which acquires an amply large molecular weight by the curing and represses the density of cross-linkage. It is particularly appropriate to use a diglycidyl ether type epoxy resin which permits easy rotation of the molecular chain part between the two ether bonds and abounds in flexibility.

When a trifunctional or higher epoxy compound which has undergone special modification, preferably modification with rubber, is adopted, the characteristics of the modifying raw material can be imparted to the epoxy compound and the degradation of flexibility due to the elevation of the crosslink density is consequently compensated. It is, therefore, permissible to use a bifunctional or higher epoxy compound which has undergone special modification, preferably modification with finely divided acrylic rubber, in combination with the glycidyl ether type epoxy resin (B) mentioned above.

By the same token, the photosensitive prepolymer (A) preferably is of such a system as decreases the number of points of cross-linkage. Specifically, what is obtained by modifying (through acrylation and incorporation of a carboxyl group) an epoxy resin having a backbone suitable for the thermosetting component is more effective in imparting high flexibility to the composition.

The use of such a bifunctional diglycidyl ether type epoxy resin as mentioned above as a thermosetting component permits the ultimately obtained cured film to acquire improved flexibility. Besides, by using a diglycidyl ether type epoxy resin containing two epoxy groups in the molecular unit thereof and resulting from modifying the aforementioned bifunctional diglycidyl ether type epoxy resin with a dibasic acid (hereinafter referred to as "dibasic acid-modified diglycidyl ether type epoxy resin"), the composition is allowed to have the developing properties further improved without degradation of flexibility and resistance to heat.

Since the photocurable and thermosetting resin composition of the present invention is such a system as permits formation of a cured film manifesting flexibility and density of cross-linkage in well balanced magnitudes as described above, it allows manufacture of a solder resist combining flexibility with the properties which the solder resist is inherently demanded to possess. By using (A) a photosensitive prepolymer soluble in a dilute aqueous alkali solution obtained by esterifying an epoxy resin represented by the general formula (1) mentioned above with (meth)acrylic acid thereby effecting acrylic modification thereof and further adding an acid anhydride thereto until an acid value reaches a level in the range of 60 to 120 mg KOH/g in combination with (B) a bifunctional diglycidyl ether type epoxy compound containing two epoxy groups in the molecular unit thereof, it is made possible to form a fine image appropriate for the densification of printed circuits prevalent today through exposure to an active energy ray and subsequent development with an aqueous alkali solution and, at the same time, permit impartation of thorough flexibility and thorough resistance to the heat of soldering as well to a cured film to be subsequently formed through post curing.

According to the present invention, therefore, there is obtained a photocurable and thermosetting resin composition developable with an aqueous alkali solution which permits formation of a fine image appropriate for the densification of printed circuits prevalent today and the high-density mounting of electronic parts on the surface of the printed circuit board and also allows formation of a cured film capable of retaining the resistance to the heat of soldering and the electrical insulating properties both of the levels normal for the conventional solder resist and manifesting high flexibility enough for the composition to be used on a flexible printed circuit board using a polyimide substrate.

Further, since the cured film which is obtained from the photocurable and thermosetting resin composition of the present invention abounds in flexibility, it also excels in resistance to the impact exerted during the press punching step (resistance to mechanical impact) and fully satisfies the other properties such as, for example, electrical insulating properties, resistance to the action of electroless gold plating, resistance to thermal deterioration, resistance to acids, and water resistance which a solder resist is demanded to possess.

Now, the photocurable and thermosetting resin composition of the present invention will be described specifically below.

First, the photosensitive prepolymer soluble in a dilute aqueous alkali solution as the component (A) is obtained, as described above, by esterifying an epoxy resin represented by the general formula (1) with (meth)acrylic acid (acrylic acid, methacrylic acid, or a mixture thereof) so as to effect acrylic modification thereof and further adding an acid anhydride to the hydroxyl group formed by the esterification reaction until an acid value reaches a level in the range of 60 to 120 mg KOH/g.

The epoxy resin as the starting material is appropriately such that the polymerization degree, n, in the general formula (1) is in the approximate range of 1 to 12, preferably in the approximate range of 2 to 6. If the polymerization degree, n, is 0, namely the epoxy resin has a small molecular weight, then the photosensitive prepolymer in the exposed area of the composition will be liable to dissolve in a developing solution during the course of development with the result of inferior resolution and the cured film consequently obtained will acquire properties fit for a solder resist only with difficulty. Conversely, if the polymerization degree, n, exceeds 12, the unexposed area of the composition will not be easily developed because the resin has a high molecular weight and a long chain.

Since the photosensitive prepolymer mentioned above has numerous free carboxyl groups added to the side chain of a backbone polymer, the composition containing this compound is developable with a dilute aqueous alkali solution. When the applied coating film of the composition is developed after exposure to light and then postcured, the epoxy group of the epoxy compound separately added to the composition as a thermosetting component causes an addition reaction with the free carboxyl groups in the side chain of the photosensitive prepolymer mentioned above and converts the coating film into a solder resist film excellent in such properties as heat resistance, solvent resistance, acid resistance, adhesiveness, and electrical properties.

The acid value of the photosensitive prepolymer mentioned above should be in the range of from 60 to 120 mg KOH/g. Any deviation of the acid value from the aforementioned range is undesirable because the resin will manifest insufficient solubility in an aqueous alkali solution if the acid value is less than 60 mg KOH/g. Conversely, the acid value exceeding 120 mg KOH/g will give cause to deteriorate the various properties of the cured film such as resistance to alkalis and electrical properties expected of a resist.

It suffices to set the molar ratio of the (meth)acrylic acid to the epoxy resin and the molar ratio of the acid anhydride to the hydroxy group formed by the esterification reaction (both partial esterification and complete esterification) suitably so that the acid value of the photosensitive polymer consequently obtained may fall in the range mentioned above.

Typical examples of the aforementioned acid anhydrides are dibasic acid anhydrides such as maleic anhydride, succinic anhydride, itaconic anhydride, phthalic anhydride, tetrahydrophtalic anhydride, hexahydrophthalic anhydride, methylhexahydrophthalic anhydride, endomethylene-tetrahydrophthalic anhydride, methylendomethylene-tetrahydrophthalic anhydride, chlorendic anhydride, and methyltetrahydrophthalic anhydride; aromatic polycarboxylic anhydrides such as trimellitic anhydride, pyromellitic anhydride, and benzophenone-tetracarboxylic dianhydride; and polycarboxylic anhydride derivatives such as 5-(2,5-dioxotetrahydrofuryl)-3-methyl-3-cyclohexene-1,2-dicarboxylic anhydride. Among other acid anhydrides, dibasic acid anhydrides prove to be desirable.

The diglycidyl ether type epoxy compound containing two epoxy groups in the molecular unit thereof as the component (B) is incorporated in the resin composition for the purpose of enabling the composition to be thermally cured. As concrete examples of the epoxy compound which answers this description, bisphenol A type epoxy resin, bisphenol F type epoxy resin, bisphenol S type epoxy resin, biphenol type epoxy resin, bixylenol type epoxy resin, hydrogenated bisphenol A type epoxy resin, and dibasic acid-modified glycidyl ether type epoxy resins thereof which are represented by the following general formula (2a) may be cited.

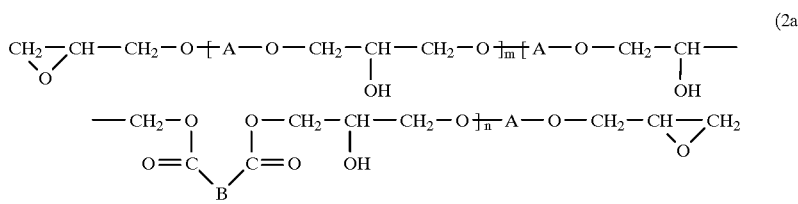

(2a)

wherein A represents

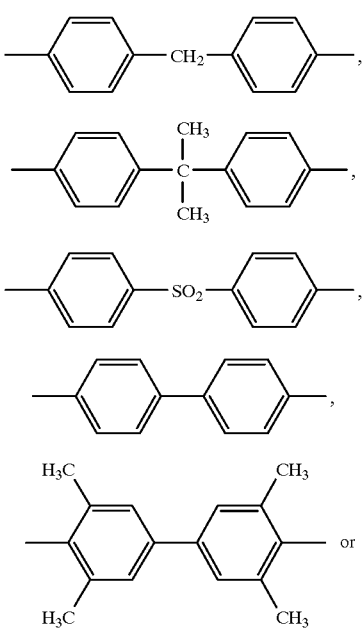

-continued

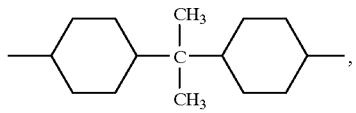

B represents

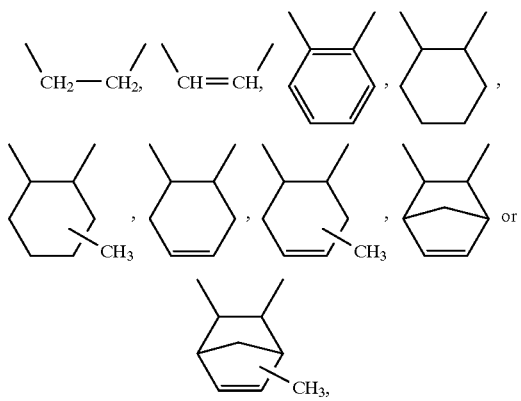

m is an average value of 0 to 12, and n is an average value of 0 to 10.

Appropriately in the epoxy resin having epoxy groups one each at the opposite terminals of a polymer chain as shown above, the polymerization degree, m, in the general formula (2a) is in the approximate range of 0 to 12 and the polymerization degree, n, of the dibasic acid modification moiety is in the approximate range of 0 to 10, preferably the polymerization degree, m, in the approximate range of 0 to 6 and the polymerization degree, n, in the approximate range of 0.1 to 6. If the polymerization degrees, m and n, exceed the ranges mentioned above, the resultant composition will suffer a marked decrease in the solubility in the dilute aqueous alkali solution and the epoxy resin in the unexposed area will possibly remain in the coating film. The term "polymerization degree" as used herein refers to the average polymerization degree obtained of various species of epoxy resin produced with varying polymerization degrees during the synthesis of the epoxy resin.

Particularly, the diglycidyl ether type epoxy compound (B) mentioned above preferably contains at least one species of the dibasic acid-modified diglycidyl ether type epoxy resin represented by the following general formula (2b) obtained by modifying the bisphenol A type epoxy resin, bisphenol F type epoxy resin, bisphenol S type epoxy resin, biphenol type epoxy resin, bixylenol type epoxy resin, or hydrogenated bisphenol A type epoxy resin mentioned above with a dibasic acid because this incorporation results in improving the developing property of the composition as described above.

wherein A represents

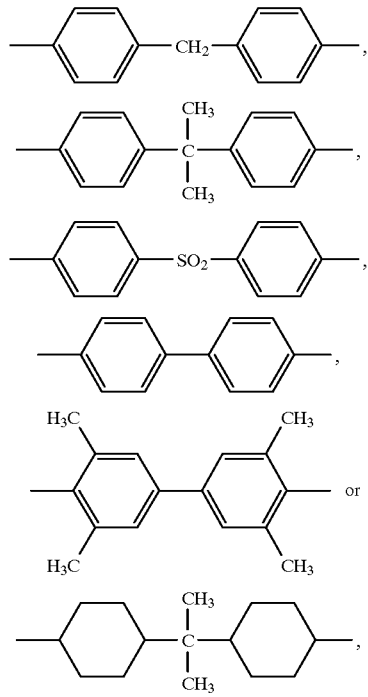

B represents

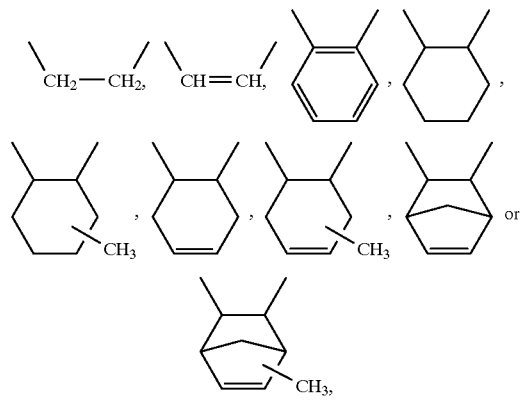

m is an average value of 0 to 12, and n is an average value of 0.1 to 10.

In the dibasic acid-modified diglycidyl ether type epoxy resin represented by the general formula (2b) mentioned above, the polymerization degree, n, of the dibasic acid modification moiety is in the approximate range of 0.1 to 10, preferably not more than 6. The polymerization degree, m,

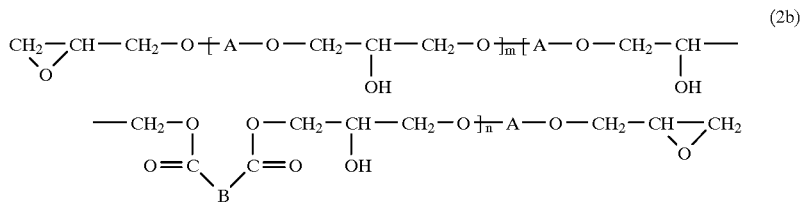

(2b)

herein is the same as that of the general formula (2a) mentioned above.

As commercially available products of the aforementioned diglycidyl ether type epoxy compound (B) containing two epoxy groups in the molecular unit, diglycidyl ethers of bisphenol A such as EPIKOTE® 828, EPIKOTE® 834, EPIKOTE® 1001, and EPIKOTE® 1002 (all products of Yuka-Shell Epoxy K.K.); diglycidyl ethers of bisphenol F such as EPIKOTE®807 (product of Yuka-Shell Epoxy K.K.); diglycidyl ethers of bisphenol S such as EBPS-200 (product of Nippon Kayaku Co., Ltd.) and EPICLON® EXA-1514 (product of Dai-Nippon Ink & Chemicals, Inc.); diglycidyl ethers of biphenol such as YL-6121 (product of Yuka-Shell Epoxy K.K.); diglycidyl ethers of bixylenol such as YX-4000 (product of Yuka-Shell Epoxy K.K.); and diglycidyl ethers of hydrogenated bisphenol A such as ST-2004 and ST-2007 (both products of Toto Kasei K.K.) may be cited.

As commercially available products of the aforementioned dibasic acid-modified diglycidyl ether type epoxy resin, ST-5100 and ST-5080 (both products of Toyo Kasei K.K.) may be cited.

As the dibasic acids which are usable for the modification, maleic acid, succinic acid, phthalic acid, tetrahydrophthalic acid, methyl tetrahydrophthalic acid, hexahydrophthalic acid, methyl hexahydrophthalic acid, endomethylene tetrahydrophthalic acid, and methyl endomethylene tetrahydrophthalic acid may be cited.

The photocurable and thermosetting resin composition of the present invention may use, as a thermosetting component, a special epoxy resin having fine particles of acrylic rubber dispersed in and/or bonded to a biphenol A type epoxy resin or a bisphenol F type epoxy resin represented by the following general formula (3) or an aliphatic liquid epoxy resin in combination with the aforementioned epoxy compound (B).

epoxy resins, p-cresol novolak type epoxy resins, alicyclic epoxy resins, bisphenol A type novolak epoxy resins, tris-hydroxyphenyl methane type epoxy resins, and tetraphenyl ethane type epoxy resins are also available for the additional use, the amounts in which they are allowed to be so used are appreciably limited because they go to rigidify the cured film.

Examples of the photopolymerization initiators or photosensitizers as the component (C) include, but are not limited to: acetophenones such as acetophenone, 2,2-diethoxy-2-phenyl acetophenone, p-dimethylaminopropiophenone, dichloroacetophenone, trichloroacetophenone, p-tert-butyl trichloroacetophenone, 2-methyl-1-[4-(methylthio)phenyl]-2-morpholinopropane-1-on, and 2-benzyl-2-dimethylamino-1-(4-morpholinophenyl)-butene-1on; benzophenones such as benzophenone, 2-chlorobenzophenone, p,p-dichlorobenzophenone, p,p-bis(dimethylamino) benzophenone, p,p-bis(diethylamino)benzophenone, and 4-benzoyl-4'-methyl-diphenyl sulfide; benzil; benzoin and ethers thereof such as benzoin methyl ether, benzoin ethyl ether, benzoin isopropyl ether, and benzoin isobutyl ether; ketals such as benzyl dimethyl ketal; thioxanthones such as thioxanthone, 2-chlorothioxanthone, and 2,4-diethylthioxanthone; anthraquinones such as 2-ethylanthraquinone and 2,3-diphenyl anthraquinone; organic peroxides such as benzoyl peroxide and cumene peroxide; thiol compounds such as 2-mercaptobenzimidazole, 2-mercaptobenzoxazole, and 2-mercaptobenzothiazole; organic halogen compounds such as 2,2,2-tribromoethanol and tribromomethylphenyl sulfone; and 2,4,6-trimethylbenzoyl diphenyl phosphine oxide, 2,4,6-tris-S-triazine, dimer of 2,4,5-triarylimidazole, and riboflavin tetrabutylate. These compounds may be used either singly or in the form of a combination of two or more members.

As the diluent of the component (D) mentioned above, various organic solvents may be used. Examples of the

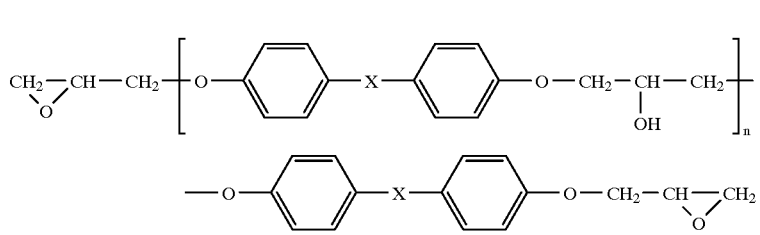

(3)

wherein X represents $CH_2$ or $C(CH_3)_2$ and n is an average value of 1 to 12.

As commercially available products of such minute acrylic rubber particles-modified epoxy resin as mentioned above, YR-528, YR-591, YR-592, YR-570, and YR-516 (products of Toto Kasei K.K.) may be cited.

These rubber-modified epoxy resins may be used either singly or in the form of a mixture of two or more members selected from among themselves in combination with the aforementioned epoxy compound (B).

Besides the aforementioned epoxy resin as a main ingredient, other epoxy resins such as, for example, diglycidyl esters like tertiary fatty acid-modified bisphenol A type polyol epoxy resins, phthalic diglycidyl esters, tetrahydrophthalic diglycidyl esters, and dimeric diglycidyl esters, and diglycidyl amines like diglycidyl aniline and diglycidyl toluidine may be additionally used in amounts not so large as to impair the object of the present invention. Though phenol novolak type epoxy resins, o-cresol novolak type organic solvents include, but are not limited to: ketones such as methyl ethyl ketone and cyclohexanone; aromatic hydrocarbons such as toluene, xylene, and tetramethyl benzene; glycol ethers such as diethylene glycol monoethyl ether and dipropylene glycol diethyl ether; esters such as ethyl acetate, butyl acetate, butyl cellosolve acetate, and carbitol acetate; aliphatic hydrocarbons such as octane and decane; and petroleum solvents such as petroleum ether, petroleum naphtha, and solvent naphtha. Among other organic solvents mentioned above, glycol ethers, esters and petroleum solvents prove to be desirable in terms of the toxicity and the properties of the resultant ink.

The organic solvent is used for the purpose of dissolving the photosensitive prepolymer (A) mentioned above, diluting the composition, allowing the composition to be applied in the from of a liquid, enabling the applied layer of the composition to form a film by the predrying, and allowing the film to be exposed to light by the so-called "contact exposure".

The resin composition of the present invention contains the aforementioned components (A), (B), (C), and (D) essentially. The ratios of combination of these components are 100 parts by weight of the component (A), 5 to 120 parts by weight, preferably 20 to 100 parts by weight, of the component (B), and 0.1 to 30 parts by weight of the component (C). If the amount of the component (B) is less than 5 parts by weight, based on 100 parts by weight of the component (A), the cured film will be deficient in resistance to heat. Conversely, if this amount exceeds 120 parts by weight, the resin composition will suffer decline of developability with an aqueous alkali solution and degradation of sensitivity after exposure to light. If the amount of the component (C) is less than 0.1 part by weight, based on 100 parts by weight of the component (A), the photosensitive prepolymer will not be sufficiently crosslinked by exposure to the active energy ray. Conversely, if this amount exceeds 30 parts by weight, the adhesion of the resin to the substrate will be inferior because the light does not easily reach the substrate.

Though the ratio of the component (D), a diluent, to be incorporated in the resin composition is not particularly restricted, it is properly in the approximate range of 5 to 300 parts by weight, preferably 5 to 110 parts by weight, based on 100 parts by weight of the component (A). This ratio may be suitably set so as to fit the method of application to be selected.

Besides the components (A) to (D) mentioned above, the photocurable and thermosetting resin composition of the present invention may contain a photopolymerizable monomer or oligomer for the purpose of aiding the aforementioned diluent in fulfilling its role and, at the same time, augmenting the photocuring properties of the resin composition.

Typical examples of photopolymerizable monomers include 2-hydroxyethyl acrylate, 2-hydroxypropyl acrylate, N-vinylpyrrolidone, acryloyl morpholine, methoxytetraethylene glycol acrylate, methoxypolyethylene glycol acrylate, polyethylene glycol diacrylate, N,N-dimethyl acrylamide, N-methylol acrylamide, N,N-dimethylaminopropyl acrylamide, N,N-dimethylaminoethyl acrylate, N,N-dimethylaminopropyl acrylate, melamine acrylate, diethylene glycol diacrylate, triethylene glycol diacrylate, propylene glycol diacrylate, dipropylene glycol diacrylate, tripropylene glycol diacrylate, polypropylene glycol diacrylate, phenoxyethyl acrylate, tetrahydrofurfuryl acrylate, cyclohexyl acrylate, glycerin diglycidyl ether diacrylate, glycerin triglycidyl ether triacrylate, isoborneolyl acrylate, cyclopentadiene mono- or di-acrylate; polyfunctional acrylates of polyhydric alcohols such as hexane diol, trimethylol propane, pentaerythritol, ditrimethylol propane, dipentaerythritol, and tris-hydroxyethyl isocyanurate and of ethylene oxide or propylene oxide adducts thereof; methacrylates corresponding to the acrylates enumerated above; and mono-, di-, tri-, and higher polyesters of polybasic acids with hydroxyalkyl (meth)acrylates.

The amount of the photopolymerizable monomer to be incorporated in the composition is desired to fall in the range of 3 to 50 parts by weight, based on 100 parts by weight of the photosensitive prepolymer (A) mentioned above. If the amount of the monomer is less than 3 parts by weight, the composition will be at a disadvantage in failing to enhance the photocuring properties. Conversely, if the amount exceeds 50 parts by weight, the composition will be at a disadvantage in failing to heighten dryness to the tack-free touch of finger.

The photocurable and thermosetting resin composition of the present invention, when necessary, may incorporate therein one or a mixture of two or more of well-known epoxy resin curing accelerators or promoters for the purpose of promoting the curing reaction of the epoxy compound (B). Examples of the epoxy resin curing promoters include, but are not limited to: imidazole and imidazole derivatives such as 2-methylimidazole, 2-ethylimidazole, 2-ethyl-4-methylimidazole, 2-phenylimidazole, 4-phenylimidazole, 1-cyanoethyl-2-phenylimidazole, and 1-(2-cyanoethyl)-2-ethyl-4-methylimidazole; guanamines such as guanamine, acetoguanamine, and benzoguanamine; and amine compounds such as dicyandiamide, benzyldimethyl amine, 4-(dimethylamino)-N,N-dimethylbenzyl amine, 4-methoxy-N,N-dimethylbenzyl amine, 4-methyl-N,N-dimethylbenzyl amine, and melamine. The promoters which are commercially available include products of Shikoku Chemicals Co., Ltd. marketed under trademark designation of "CUREZOL" 2MZ-A, 2MZ-OK, 2PHZ, 2P4BHZ, and 2P4MHZ (invariably imidazole type compounds) and products of Sun-Apro K.K. marketed under product codes of U-CAT3503X and U-CAT3502X (invariably isocyanate compounds blocked with dimethyl amine), for example. It is desired to lower the reaction starting temperature by having an epoxy resin curing accelerator incorporated in the composition. If this accelerator is incorporated in an unduly large amount, the excess of the accelerator will entrain the drawback of shortening the shelf life of the photocurable and thermosetting resin composition prepared in a single liquid formulation. The amount of the epoxy resin curing accelerator to be incorporated in the composition, therefore, is desired to be in the range of from 0.1 to 10.0 parts by weight, based on 100 parts by weight of the photosensitive prepolymer (A) mentioned above.

The thermosetting component mentioned above may be mixed in advance with the aforementioned photosensitive resin composition. Since the composition containing both this thermosetting component and the photosensitive prepolymer is liable to gain in viscosity prior to being applied to a blank circuit board, however, it is proper to have them mixed immediately prior to use as generally practiced. To be specific, it is appropriate to prepare two separate solutions, i.e. a main component solution comprising the aforementioned photosensitive prepolymer (A) as a main component and an epoxy resin curing agent and a hardener solution comprising the aforementioned epoxy compound (B) as a main component, and mix these solutions prior to use.

Further, the photocurable and thermosetting resin composition of the present invention may incorporate therein, depending on the desired properties thereof, a well known and widely used filler such as barium sulfate, silicon dioxide, talc, clay, calcium carbonate, silica, bentonite, kaolin, glass fiber, carbon fiber, and mica; a well known and widely used dye or color pigment such as phthalocyanine blue, phthalocyanine green, titanium dioxide, and carbon black; various additives such as an anti-foaming agent, a flame-retardant, an adhesiveness-imparting agent, and a leveling agent; and a well known and widely used polymerization inhibitor such as hydroquinone, hydroquinone monomethyl ether, pyrogallol, t-butyl catechol, and phenothiazine.

The photocurable and thermosetting resin composition of the present invention is adjusted, when necessary, to a level of viscosity suitable for the coating method, applied by the technique of screen printing, curtain coating, spray coating, roll coating, or the like to a printed circuit board having a circuit already formed thereon, for example, and then dried at a temperature in the range of from 60 to 100° C., for example, thereby to evaporate the organic solvent from the coated composition and give rise to a tack-free coating film. Then, the composition coated on the printed circuit board is selectively exposed to an actinic ray through a photomask having a prescribed pattern and the composition in the unexposed areas of the coating film is developed with a dilute aqueous alkali solution to obtain a resist pattern. Thereafter, the photocured coating film is further thermally cured by subjecting to the heat treatment at a temperature in the range of from 140 to 180° C., for example, to obtain a resist film exhibiting excellent flexibility. By this thermal treatment, in addition to the curing reaction of the aforementioned thermosetting components, the polymerization of the photosensitive resin components is promoted so that the consequently produced resist film acquires improvements in various properties such as resistance to heat, resistance to solvents, resistance to acids, adhesiveness to the substrate, and electrical properties.

As an aqueous alkali solution to be used in the process of development mentioned above, aqueous alkali solutions of potassium hydroxide, sodium hydroxide, sodium carbonate, potassium carbonate, sodium phosphate, sodium silicate, ammonia, amines, etc. can be used.

Examples of light sources which are advantageously used for the purpose of photocuring the composition include low-pressure mercury vapor lamp, medium-pressure mercury vapor lamp, high-pressure mercury vapor lamp, ultra-high-pressure mercury vapor lamp, xenon lamp, and metal halide lamp, for example. Also, a laser beam may be used as the actinic ray for exposure of the film.

Now, the present invention will be more specifically described below with reference to working examples. Wherever "parts" and "%" are mentioned hereinbelow, they invariably refer to those based on weight unless otherwise specified. Synthesis of photosensitive prepolymer:

Synthetic Example 1

In 462.5 parts of dimethyl sulfoxide, 380 parts of a bisphenol F epoxy resin having $CH_2$ for X, H for all the Y's and an average of 6.2 for the polymerization degree, n, in the aforementioned general formula (1) (an epoxy equivalent weight of 950 g/eq. and a softening point of 85° C.) and 925 parts of epichloro-hydrin were dissolved. The resultant solution was kept stirred at 70° C. and 60.9 parts (1.5 mols) of 98.5% NaOH was added meanwhile thereto over a period of 100 minutes. After the addition, the reaction was continued at 70° C. for three hours. After the reaction was completed, the reaction solution was washed with 250 parts of water. After the separation of oil and water, the oil layer was distilled under a reduced pressure to recover the greater part of dimethyl sulfoxide and the excess of unaltered epichlorohydrin. The reaction product containing a residual by-produced salt and dimethylsulfoxide was dissolved in 750 parts of methyl isobutyl ketone. The resultant solution and 10 parts of 30% NaOH added thereto were left reacting at 70° C. for one hour. After the reaction was completed, the reaction mixture was washed twice with 200 parts of water. After the separation of oil and water, the oil layer was distilled to recover methyl isobutyl ketone and obtain an epoxy resin (a) having an epoxy equivalent weight of 310 g/eq. and a softening point of 69° C. The epoxy resin (a) thus obtained was found by a calculation based on the epoxy equivalent weight to have resulted from the epoxidization of about 5 of 6.2 alcoholic hydroxyl groups in the bisphenol F type epoxy resin as the starting material mentioned above.

Into a flask, 310 parts of the epoxy resin (a) and 282 parts of carbitol acetate were charged. The mixture was heated and stirred to 90° C. until solution. The produced solution was once cooled to 60° C. The cooled solution and 72 parts (1 mol) of acrylic acid, 0.5 part of methyl hydroquinone, and 2 parts of triphenyl phosphine added thereto were heated to 100° C. and left reacting for about 60 hours. Thus, a reaction product having an acid value of 0.2 mg KOH/g was obtained. The reaction product and 140 parts (0.92 mol) of tetrahydrophthalic anhydride added thereto were heated to 90° C. and left reacting until an acid value of a solid content reached 100 mg KOH/g. Consequently, a resin (A-1) having a solid concentration of 65% was obtained.

Synthetic Example 2

Into a flask, 220 parts (1 equivalent weight) of cresol novolak type epoxy resin (produced by Nippon Kayaku Co., Ltd. and marketed under product code of "EOCN-104S", a softening point; 92° C., an epoxy equivalent weight; 220 g/eq.), 140.1 parts of carbitol acetate, and 60.3 parts of solvent naphtha were charged. The mixture was heated and stirred at 90° C. until solution. The solution consequently obtained was cooled once to 60° C. The cooled solution and 72 parts (1 mol) of acrylic acid, 0.5 part of methyl hydroquinone, and 2 parts of triphenyl phosphine added thereto were heated to 100° C. and left reacting for about 12 hours to obtain a reaction product having an acid value of 0.2 mg KOH/g. This reaction product and 80.6 parts (0.53 mol) of tetrahydrophthalic anhydride added thereto were heated to 90° C. and left reacting for about 6 hours to obtain a resin (A-2) having an acid value of a solid content of 80 mg KOH/g and a solid concentration of 65%. Synthesis of dibasic acid-modified diglycidyl ether type epoxy resin:

Synthetic Example 3

Into a flask, 188 parts (1 equivalent weight) of a bisphenol A type epoxy resin (product of Yuka-Shell Epoxy K.K., EPIKOTE® 828, an epoxy equivalent weight; 188 g/eq.) was charged and heated to 100° C. and stirred. To this epoxy resin, a solution obtained by dissolving 51 parts (0.6 equivalent weight) of tetrahydrophthalic acid and 4.5 parts of triphenyl phosphine in 100 parts of carbitol acetate was added dropwise through a dropping funnel over a period of 48 hours. The resultant mixture was continuously stirred for 48 hours to obtain a dibasic acid-modified diglycidyl ether epoxy resin (B-1) having an epoxy equivalent weight of 600 g/eq. and a solid concentration of 70%.

A main agent (component for composition (a-1) or (a-2)) was prepared by combining the photosensitive prepolymer (resin (A-1) or resin (A-2)) obtained in Synthetic Example 1 or 2, photopolymerization initiators (2-methyl-1-[4-(methylthio) phenyl]-2-morpholino-propan-1-on: product of Ciba Geigy, Irgacure® 907 and diethyl thioxanthone)), a photopolymerizable monomer (triacrylated adduct of ethylene oxide to trimethylol propane: produced by Daiichi Kogyo Seiyaku Co., Ltd. and marketed under product code of "TMP-3"), a filler (finely pulverized silica), an epoxy curing promotor (melamine), and a silicone type antifoaming agent (produced by Shinetsu Chemical Industry Co., Ltd. and marketed under product code of "KS-66") at proportions shown in Table 1 and kneading the resultant mixture.

Separately, various epoxy resins shown in Table 2 were used as hardeners (component (b-1) to (b-5)) at varying proportions indicated in the same table.

Prior to use, the main agent and the hardener were mixed at a varying ratio indicated in Table 3 to prepare a resist ink composition.

TABLE 1

| Components for composition (parts by weight) | a-1 | a-2 |
|---|---|---|
| Resin (A-1) having a solid content of 65% | 154 | — |
| Resin (A-2) having a solid content of 65% | — | 154 |
| Irgacure 907 | 10 | 10 |
| Diethyl thioxanthone | 1.2 | 1.2 |
| TMP-3 | 16 | 16 |
| Finely pulverized silica | 10 | 10 |
| Melamine | 1.2 | 1.2 |
| KS-66 | 1 | 1 |

TABLE 2

| Components for composition (parts by weight) | b-1 | b-2 | b-3 | b-4 | b-5 |
|---|---|---|---|---|---|
| EPIKOTE 1001[1] | 66 | 30 | — | — | — |
| YR-528[2] | — | 20 | — | — | — |
| ST-5100[3] | — | — | 70 | — | — |
| Resin B-1 of Synthetic Example 3 having a solid content of 70% | — | — | — | 60 | — |
| YX-4000[4] | — | — | 10 | 10 | — |
| DEN 438[5] | — | — | — | — | 30 |

[1] Bisphenol A epoxy resin (solid concentration of 75% in carbitol acetate) produced by Yuka-Shell Epoxy K.K.
[2] Rubber-modified epoxy resin produced by Toto Kasei K.K.
[3] Dibasic acid-modified epoxy resin (solid concentration of 70% in carbitol acetate) produced by Toto Kasei K.K.
[4] Bixylenol epoxy resin produced by Yuka-Shell Epoxy K.K.
[5] Phenol novolak epoxy resin produced by The Dow Chemical Company.

Method of Evaluation

The resist ink compositions obtained as described above were evaluated as follows. The resist ink compositions of working examples and comparative examples shown in Table 3 were each applied to a printed circuit board (having a copper foil laminated on polyimide film) by the screen printing technique and dried at 80° C. for 20 minutes. Then, the substrate, with a negative film of a prescribed pattern applied thereto, was irradiated with an ultraviolet light of a calculated amount of exposure of 500 mJ/cm² by the use of an exposing device, developed with an aqueous 1 wt % $Na_2CO_3$ solution, and further thermally cured at 150° C. for 50 minutes to manufacture a test substrate. The test substrate was tested for developability with an aqueous alkali solution, resistance to the heat of soldering, flexibility, resistance to thermal deterioration, and resistance to electroless gold plating. The results are shown in Table 3. The methods of evaluation and the standards of evaluation are as follows.

(1) Developability with an aqueous alkali solution

The coating was dried at 80° C. The test substrate was extracted at intervals of 10 minutes between the 20th and the 70th minutes and tested for developability by the spray development using an aqueous 1 wt % $Na_2CO_3$ solution at 30° C. The developability was rated on the following two-point scale.

O: Absence of visually discernible residue x: Presence of visually discernible residue (2) Resistance to the heat of soldering The test substrate was coated with a rosin type flux and immersed for 10 seconds in molten solder kept at 260° C. After the removal of the flux, the substrate was subjected to a peel test using a cellophane adhesive tape as to the peeling of the cured film. The result of this test was rated on the following two-point scale.

O: Absence of any discernible change x: Presence of peeling of the cured film (3) Flexibility The test substrate was folded 180° over itself to examine the flexibility. The result of this test was rated on the following two-point scale.

O: Absence of crack x: Separation of the cured film due to a crack in the folded part (4) Resistance to thermal deterioration The test substrate was left standing at 125° C. for 5 days and then folded 180° over itself to examine a change in the flexibility. The result of this test was rated on the following two-point scale.

O: Absence of crack x: Separation of the cured film due to a crack in the folded part (5) Resistance to electroless gold plating The test substrate was plated with gold by the method as specified below. Then the test substrate was subjected to a peel test with the use of a cellophane adhesive tape and peeling conditions of the cured film were evaluated on the following three-point scale.

O: Absence of any discernible change

Δ: Slight peeling of the cured film was observed x: Peeling of the cured film was observed Method for electroless gold plating The test substrate was degreased by dipping in an acidic degreasing solution (a 20% by vol. solution of Metex L-5B manufactured by Fuji Chemical Industries Co., Ltd.) at 30° C. for 3 minutes and then washed with water by dipping in running water for 3 minutes. Next, the test substrate was subjected to soft etching by dipping in an aqueous 14.3 wt % ammonium persulfate solution at room temperature for 3 minutes and then washed with water by dipping in running water for 3 minutes. After dipping in an aqueous 10% by vol. sulfuric acid solution for one minute at room temperature, the test substrate was washed with water by dipping in running water for 30 seconds to one minute. Then it was dipped in a catalyst solution (a 10% by vol. aqueous solution of Metal plate Activator 350 manufactured by Meltex Inc.) at 30° C. for 7 minutes to thereby add the catalyst thereto and then washed with water by dipping in running water for 3 minutes. This test substrate having the catalyst added thereto was subjected to electroless nickel plating by dipping in a nickel plating solution (a 20% by vol. aqueous solution of Melplate Ni-865M, manufactured by Meltex Inc., pH 4.6) at 85° C. for 20 minutes. After dipping in an aqueous 10% by vol. sulfuric acid solution at room temperature for one minute, the test substrate was washed with water by dipping in running water for 30 seconds to one minute. Next, the test substrate was subjected to electroless gold plating by dipping in a gold plating solution (an aqueous solution of 15% by vol. of Aurolectroless UP manufactured by Meltex Inc. and 3% by vol. of gold potassium cyanide, pH 6) at 95° C. for 10 minutes. Then it was washed with water by dipping in running water for 3 minutes and with hot water by dipping in hot water at 60° C. for 3 minutes. After sufficient washing with water, thorough draining, and drying, an electroless gold plated test substrate was obtained.

TABLE 3

| Example No. | | Working examples | | | | Comparative examples | | |
|---|---|---|---|---|---|---|---|---|
| | | 1 | 2 | 3 | 4 | 1 | 2 | 3 |
| Component (a) | | a-1 | a-1 | a-1 | a-1 | a-1 | a-2 | a-2 |
| Component (b) | | b-1 | b-2 | b-3 | b-4 | b-5 | b-1 | b-3 |
| Developability | 20 min. | o | o | o | o | o | o | o |
| | 30 min. | o | o | o | o | o | o | o |
| | 40 min. | o | o | o | o | o | o | o |
| | 50 min. | x | x | o | o | o | x | o |
| | 60 min. | x | x | o | o | o | x | o |
| | 70 min. | x | x | o | o | o | x | x |
| Resistance to the heat of soldering | | o | o | o | o | o | o | o |
| Flexibility | | o | o | o | o | x | x | x |
| Resistance to thermal deterioration | | o | o | o | o | x | x | x |
| Resistance to electroless gold plating | | o | o | o | o | o | o | Δ |

It is clearly noted from the results shown in Table 3 that the resist ink compositions of Examples 1 to 4 invariably produced cured films which exhibited developability with an aqueous alkali solution and excelled in resistance to the heat of soldering, flexibility, resistance to thermal deterioration, and resistance to electroless gold plating. Particularly, the resist ink compositions of Examples 3 and 4 which contained a dibasic acid-modified diglycidyl ether type epoxy resin as a thermosetting component exhibited perfect developability with an aqueous alkali solution over a period of 70 minutes during which the coating was dried at 80° C. In contrast, the resist ink composition of Comparative Example 1 which used a phenol novolak type epoxy resin as a thermosetting component failed to produce a cured film possessing ample flexibility and resistance to thermal deterioration, though it exhibited satisfactory developability with an aqueous alkali solution. The resist ink compositions of Comparative Examples 2 and 3 which used, as a photosensitive prepolymer, the resin (A-2) obtained in Synthetic Example 2 and possessing a cresol novolak type epoxy resin as a backbone structure invariably failed to produce a cured film fully satisfying flexibility and resistance to thermal deterioration.

While certain specific working examples have been disclosed herein, the invention may be embodied in other specific forms without departing from the spirit or essential characteristics thereof. The described examples are therefore to be considered in all respects as illustrative and not restrictive, the scope of the invention being indicated by the appended claims rather than by the foregoing description and all changes which come within the meaning and range of equivalency of the claims are, therefore, intended to be embraced therein.

What is claimed is:

1. A photocurable and thermosetting resin composition developable with an aqueous alkali solution, which comprises in combination:

(A) a photosensitive prepolymer soluble in a dilute aqueous alkali solution obtained by esterifying an epoxy resin represented by the following general formula (1) with acrylic acid and/or methacrylic acid to form an esterification product and further reacting the esterification product with an acid anhydride until an acid value reaches a level in the range of 60 to 120 mg KOH/g,

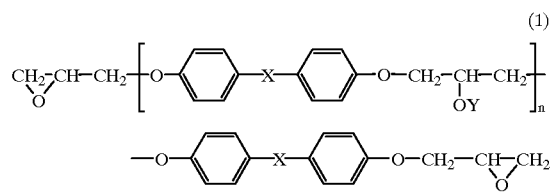

(1)

wherein X represents $CH_2$, $C(CH_2)_2$, or $SO_2$, n is an average value in the range of 1 to 12, and Y represents a hydrogen atom or a glycidyl group, providing that Y is a glycidyl group where n is 1 and at least one of the plurality of Y's is a glycidyl group where n is 2 or more, (B) an epoxy compound having two glycidyl ether groups in its molecule, (C) a photopolymerization initiator, and (D) a diluent at such ratios of combination that said epoxy compound (B) accounts for a proportion in the range of 5 to 120 parts by weight and said photopolymerization initiator (C) for a proportion in the range of 0.1 to 30 parts by weight, based on 100 parts by weight of said photosensitive prepolymer (A).

2. The composition according to claim 1, wherein said epoxy compound (B) contains at least one of the epoxy compounds represented by the following general formula (2a).

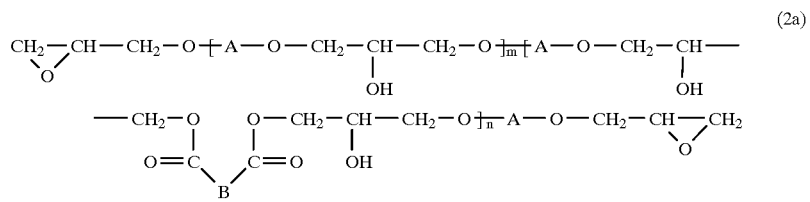

(2a)

wherein A represents

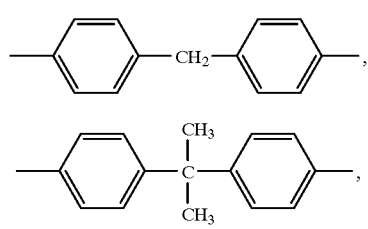

-continued

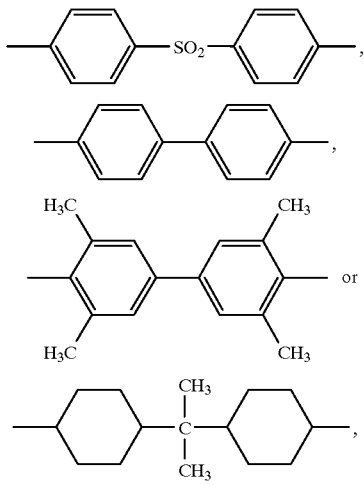

B represents

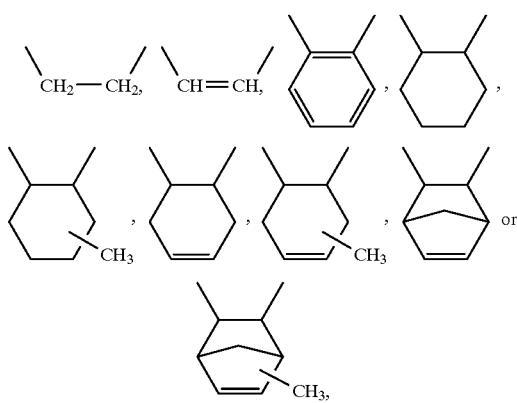

m is an average value in the range of 0 to 12, and n is an average value in the range of 0 to 10.

3. The composition according to claim 1, wherein said epoxy compound (B) contains at least one of the epoxy compounds represented by the following general formula (2b).

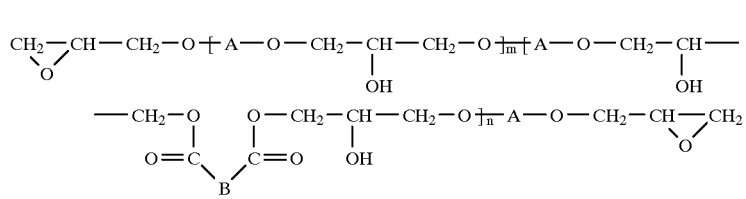

(2b)

wherein A represents

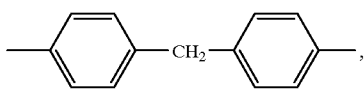

-continued

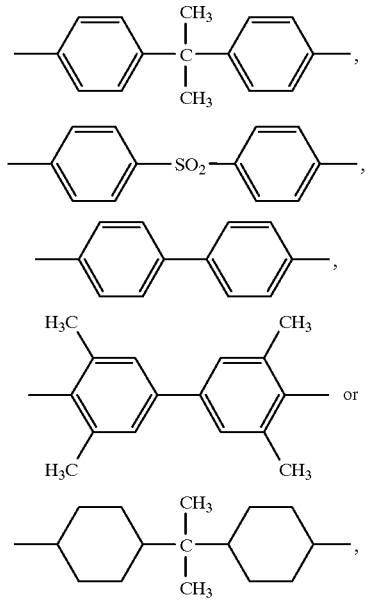

B represents m is an average value in the range of 0 to 12, and n is an average value in the range of 0.1 to 10.

4. The composition according to claim 1, wherein said epoxy compound (B) contains an acrylic rubber-modified epoxy resin having fine particles of acrylic rubber dispersed in and/or bonded to a biphenol A epoxy resin or a bisphenol F epoxy resin represented by the following general formula (3) or an aliphatic liquid epoxy resin:

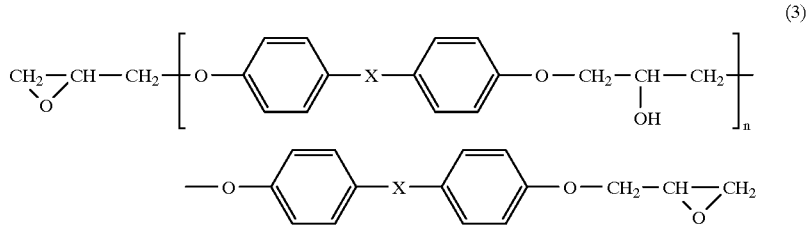

wherein X represents $CH_2$ or $C(CH_3)_2$ and n is an average value of 1 to 12.

5. The composition according to claim 1, wherein the ratios of combination of the components of said composition are such that said epoxy compound (B) accounts for a proportion in the range of 20 to 100 parts by weight, said photopolymerization initiator (C) for a proportion in the range of 0.1 to 30 parts by weight, and said diluent (D) for a proportion in the range of 5 to 110 parts by weight, based on 100 parts by weight of said photosensitive prepolymer (A).

6. The composition according to claim 1, wherein said acid anhydride is selected from the group consisting of maleic anhydride, succinic anhydride, itaconic anhydride, phthalic anhydride, tetrahydrophthalic anhydride, hexahydrophthalic anhydride, methylhexahydrophthalic anhydride, endomethylene-tetrahydrophthalic anhydride, methylendomethylene-tetrahydrophthalic anhydride, chlorendic anhydride, methyltetrahydrophthalic anhydride, trimellitic anhydride, pyromellitic anhydride, benzophenone-tetracarboxylic dianhydride, and 5-(2,5-dioxotetrahydrofuryl)-3-methyl-3-cyclohexene-1,2-dicarboxylic anhydride.

7. The composition according to claim 1, wherein said photopolymerization initiator is at least one compound selected from the group consisting of benzil, benzoin, alkyl ethers of benzoin, acetophenones, benzophenones, ketals, thioxanthones, anthraquinones, organic peroxides, thiol compounds, organic halogen compounds, and 2,4,6-trimethylbenzoyl diphenyl phosphine oxide.

8. The composition according to claim 1, wherein said diluent is at least one organic solvent selected from the group consisting of ketones, aromatic hydrocarbons, glycol ethers, esters, aliphatic hydrocarbons, and petroleum solvents.

9. The composition according to claim 1, which further comprises a photopolymerizable monomer in an amount of 3 to 50 parts by weight, based on 100 parts by weight of said photosensitive prepolymer.

10. The composition according to claim 1, which further comprises an epoxy resin curing promotor in an amount of about 0.1 to about 10 parts by weight, based on 100 parts by weight of said photosensitive prepolymer.

11. The composition according to claim 1, which further comprises an inorganic filler, a dye or color pigment, an anti-foaming agent, a flame-retardant, an adhesiveness-imparting agent, a leveling agent, or a polymerization inhibitor.

12. A photocurable and thermosetting resin composition developable with an aqueous alkali solution, which comprises in combination:

(A) a photosensitive prepolymer soluble in a dilute aqueous alkali solution obtained by esterifying an epoxy resin represented by the following general formula (1) with acrylic acid and/or methacrylic acid to form an esterification product and further reacting the esterification product with an acid anhydride until an acid value reaches a level in the range of 60 to 120 mg KOH/g:

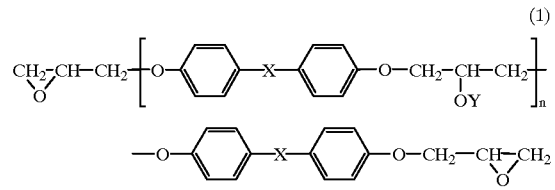

wherein X represents $CH_2$, $C(CH_3)_2$, or $SO_2$, n is an average value in the range of 1 to 12, and Y represents a hydrogen atom or a glycidyl group, providing that Y is a glycidyl group where n is 1 and at least one of the plurality of Y's is a glycidyl group where n is 2 or more, (B) an epoxy compound represented by the following general formula (2b):

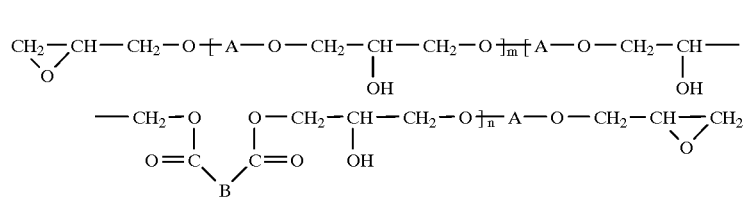

wherein A represents

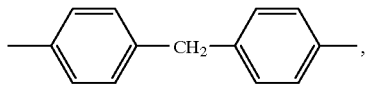

-continued

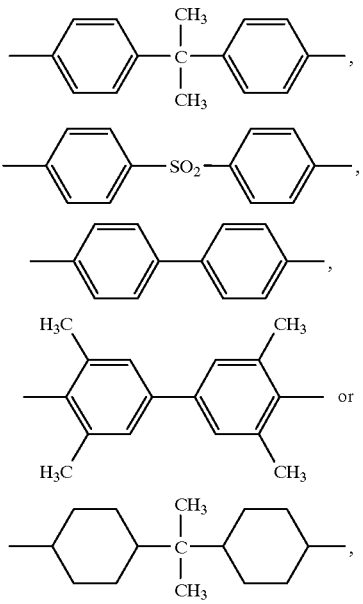

B represents

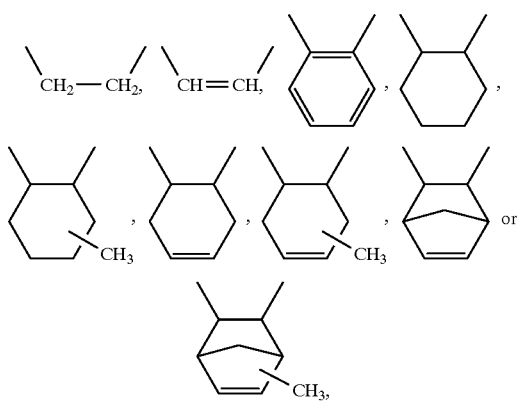

m is an average value in the range of 0 to 12, and n is an average value in the range of 0.1 to 10.

(C) a photopolymerization initiator,
(D) an organic solvent, and
(E) an epoxy resin curing promotor at such ratios of combination that said epoxy compound (B) accounts for a proportion in the range of 5 to 120 parts by weight and said photopolymerization initiator (C) for a proportion in the range of 0.1 to 30 parts by weight, based on 100 parts by weight of said photosensitive prepolymer (A).

13. The composition according to claim 12, wherein said organic solvent is selected from the group consisting of ketones, aromatic hydrocarbons, glycol ethers, esters, aliphatic hydrocarbons, and petroleum solvents and present in an amount of 5 to 300 parts by weight, based on 100 parts by weight of said photosensitive prepolymer.

14. The composition according to claim 12, wherein said epoxy resin curing promotor is selected from the group consisting of imidazole and derivatives thereof, guanamines, and amine compounds and present in an amount of about 0.1 to about 10 parts by weight, based on 100 parts by weight of said photosensitive prepolymer.

15. The composition according to claim 12, which further comprises a photopolymerizable monomer in an amount of 3 to 50 parts by weight, based on 100 parts by weight of said photosensitive prepolymer.

16. The composition according to claim 12, which further comprises an inorganic filler, a dye or color pigment, an anti-foaming agent, a flame-retardant, an adhesiveness-imparting agent, a leveling agent, or a polymerization inhibitor.

17. A flexible printed circuit, comprising a plastic film having an electrical circuit formed thereon and a solder mask prepared by using the photocurable and thermosetting resin composition set forth in claim 1.

18. A flexible printed circuit, comprising a plastic film having an electrical circuit formed thereon and a solder mask prepared by using the photocurable and thermosetting resin composition set forth in claim 12.

* * * * *